United States Patent
Griswold et al.

(10) Patent No.: US 10,761,167 B2
(45) Date of Patent: Sep. 1, 2020

(54) SYSTEM AND METHOD FOR GENERATING A MAGNETIC RESONANCE FINGERPRINTING DICTIONARY USING SEMI-SUPERVISED LEARNING

(71) Applicant: Case Western Reserve University, Cleveland, OH (US)

(72) Inventors: Mark A. Griswold, Shaker Heights, OH (US); Mingrui Yang, Beachwood, OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 16/387,264

(22) Filed: Apr. 17, 2019

(65) Prior Publication Data

US 2019/0353730 A1    Nov. 21, 2019

Related U.S. Application Data

(60) Provisional application No. 62/673,819, filed on May 18, 2018.

(51) Int. Cl.
*G01R 33/48* (2006.01)
*G06N 20/00* (2019.01)
*G01R 33/56* (2006.01)

(52) U.S. Cl.
CPC ..... *G01R 33/4828* (2013.01); *G01R 33/5608* (2013.01); *G06N 20/00* (2019.01)

(58) Field of Classification Search
CPC ............ G01R 33/4828; G01R 33/5608; G01R 33/5602; G01R 33/5614; G01R 33/5613; G01R 33/50; G06N 20/00
See application file for complete search history.

(56) References Cited

U.S. PATENT DOCUMENTS

| 8,723,518 | B2 | 5/2014 | Seiberlich | |
| 10,509,086 | B2* | 12/2019 | Amthor | G01R 33/4828 |
| 2012/0262165 | A1* | 10/2012 | Griswold | G01R 33/50 |
| | | | | 324/309 |
| 2014/0167754 | A1* | 6/2014 | Jerecic | G01R 33/56 |
| | | | | 324/309 |
| 2015/0301141 | A1 | 10/2015 | Griswold | |
| 2015/0346301 | A1* | 12/2015 | Cauley | G01R 33/4828 |
| | | | | 324/309 |

(Continued)

OTHER PUBLICATIONS

Goodfellow I. J. et al, "Generative adversarial networks," arXiv, 2014.

(Continued)

*Primary Examiner* — G. M. A Hyder
(74) *Attorney, Agent, or Firm* — Quarles & Brady LLP

(57) ABSTRACT

A method for creating a dictionary for a magnetic resonance fingerprinting (MRF) reconstruction includes training a semi-supervised learning system based on at least a set of MRF data and a set of control variables and generating a plurality of signal evolutions using the trained semi-supervised learning system. The method also includes generating an MRF dictionary using the plurality of signal evolutions generated using the trained semi-supervised learning system and storing the MRF dictionary in a memory. In one embodiment, the semi-supervised learning system is a MRF generative adversarial network (GAN).

19 Claims, 5 Drawing Sheets

(56) References Cited

U.S. PATENT DOCUMENTS

| | | | | |
|---|---|---|---|---|
| 2017/0035319 | A1* | 2/2017 | Zhao | A61B 5/055 |
| 2017/0053402 | A1* | 2/2017 | Migukin | G06T 7/0012 |
| 2017/0160363 | A1* | 6/2017 | Chen | G06N 3/08 |
| 2017/0319098 | A1* | 11/2017 | Wang | A61B 5/055 |
| 2018/0203081 | A1* | 7/2018 | Cohen | G01R 33/50 |
| 2018/0231626 | A1* | 8/2018 | Gulani | A61B 5/055 |
| 2018/0238983 | A1* | 8/2018 | Cohen | G01R 33/543 |
| 2018/0292484 | A1* | 10/2018 | Hoppe | G01R 33/5602 |
| 2019/0094322 | A1* | 3/2019 | Braun | G01R 33/56 |
| 2019/0285712 | A1* | 9/2019 | Gulani | G01R 33/56308 |
| 2019/0353730 | A1* | 11/2019 | Griswold | G01R 33/5608 |
| 2019/0353731 | A1* | 11/2019 | Liu | G01R 33/54 |
| 2019/0361080 | A1* | 11/2019 | Nittka | G01R 33/5608 |
| 2020/0158805 | A1* | 5/2020 | Griswold | G01R 33/50 |

OTHER PUBLICATIONS

Hamilton J. I., et al. "Mr fingerprinting with chemical exchange (mrf-x) to quantify subvoxel t1 and extracellular volume fraction," Journal of Cardiovascular Magnetic Resonance, vol. 17, No. 1, pp. 1-3, 2015. [Online]. Available: http://dx.doi.org/10.1186/1532-429X-17-S1-W35.

Jiang, Y. et al, "Mr fingerprinting using fast imaging with steady state precession (fisp) with spiral readout," Magnetic Resonance in Medicine, vol. 74, No. 6, pp. 1621-1631, 2015. [Online]. Available: http://dx.doi.org/10.1002/mrm.25559.

Ma, D. et al., "Magnetic Resonance Fingerprinting," Nature, 2013; 495 (7440): 187-192.

* cited by examiner

SYSTEM AND METHOD FOR GENERATING A MAGNETIC RESONANCE FINGERPRINTING DICTIONARY USING SEMI-SUPERVISED LEARNING

CROSS-REFERENCE TO RELATED APPLICATION

This application is based on, claims priority to, and incorporates herein by reference in its entirety U.S. Ser. No. 62/673,819 filed May 18, 2018, and entitled "System And Method For Learning Bloch Equations Via Generative Adversarial Network For Use in Magnetic Resonance Fingerprinting."

STATEMENT REGARDING FEDERALLY SPONSORED RESEARCH

This invention was made with government support under EB016728 and EB017219 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," *Nature*, 2013; 495 (7440): 187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency ("RF") field is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

The dictionary of signal evolutions is one of the key components of MRF. A dictionary may include signal evolutions that have been generated for different acquisition parameters from magnetic resonance signal models, such as Bloch equation-based physics simulations or that have been collected from previous acquisitions. Depending on the tissue property of interest, a dictionary may be calculated using different MRF sequences, such as the bSSFP sequence, the FISP sequence, the MRF-X sequence, or the like. The time required for generating these dictionaries varies, but can be prohibitively long, especially when many factors are included into the calculation. For example, a slice profile corrected FISP dictionary requires the simulation of multiple spin evolutions which are then summed for each time frame. Dictionary calculations that involve exchange and other complicated physics can take days to weeks to calculate.

There is a need for a system and method for generating a dictionary for MRF that is efficient and reduces the time required for generating the dictionary.

SUMMARY OF THE DISCLOSURE

In accordance with an embodiment, a method for creating a dictionary for a magnetic resonance fingerprinting (MRF) reconstruction includes training a semi-supervised learning system based on at least a set of MRF data and a set of control variables, generating a plurality of signal evolutions using the trained semi-supervised learning system; generating an MRF dictionary using the plurality of signal evolutions generated using the trained semi-supervised learning system and storing the MRF dictionary in a memory.

In accordance with another embodiment, a method for performing magnetic resonance fingerprinting includes accessing a MRF dictionary using an MRI system, the MRF dictionary generated using a semi-supervised learning system, acquiring MRF data from a tissue in region of interest in a subject using the MRI system, comparing the MRF data to the MRF dictionary to identify at least one parameter of the MRF data and generating a report indicating a value of at least one parameter of the MRF data.

In accordance with another embodiment, a magnetic resonance fingerprinting (MRF) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The system further includes a computer system programmed to access an MRF dictionary, the MRF dictionary generated using a semi-supervised learning system, acquire MRF data from a tissue in a region of interest in a subject, compare the MRF data to the MRF dictionary to identify at least one parameter of the MRF data and generate a report indicating a value of the at least one parameter of the MRF data.

BRIEF DESCRIPTION OF THE DRAWINGS

The present invention will hereafter be described with reference to the accompanying drawings, wherein like reference numerals denote like elements.

DETAILED DESCRIPTION

Figure 1:
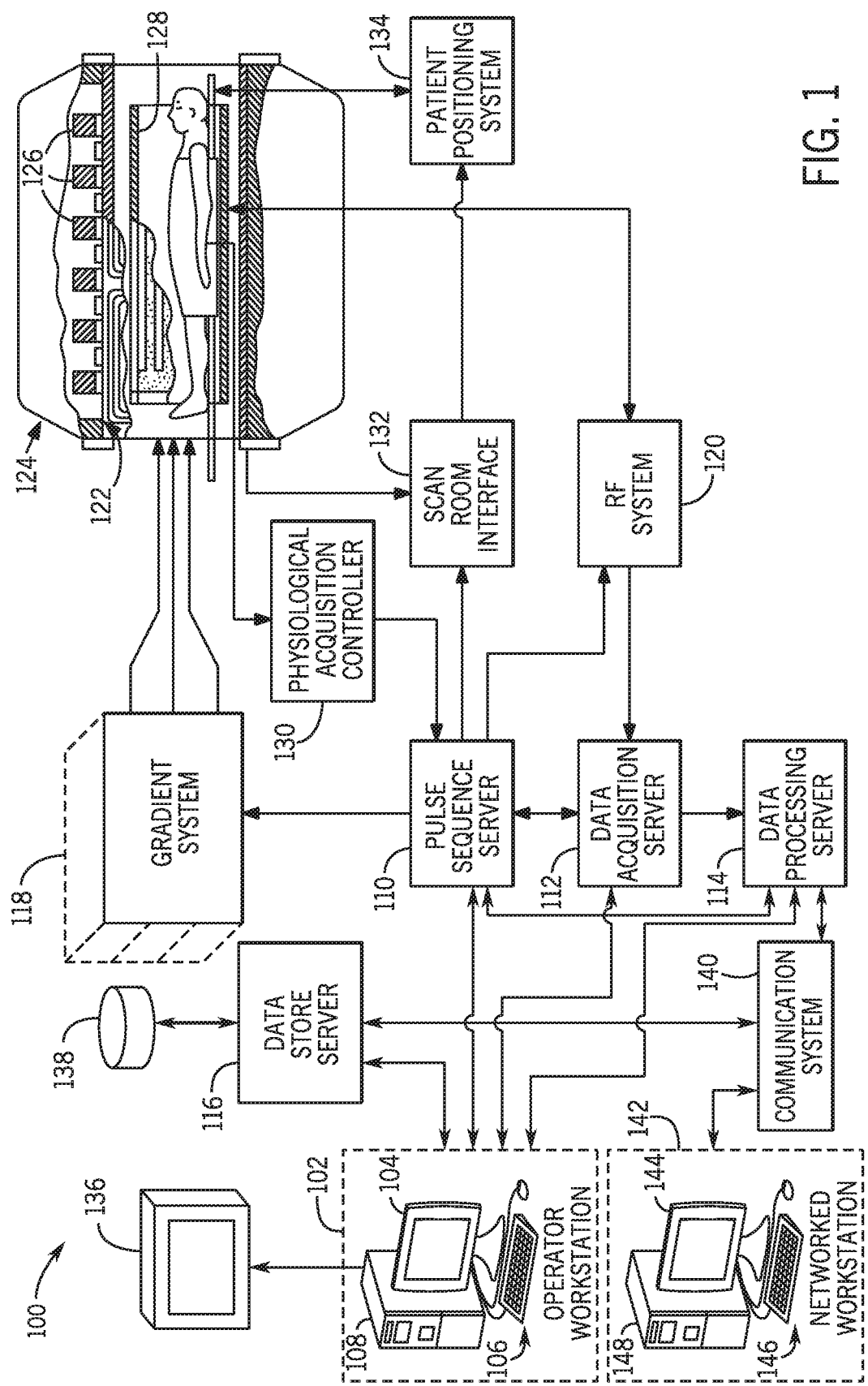
FIG. 1 is a schematic diagram of an example MRI system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF field is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE"), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha,\phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots)$ or may include fewer terms, such as by not including the diffusion relaxation, as $E_i(T_1,T_2)$ or $E_i(T_1,T_2, \ldots)$. Also, the summation on "j" could be replace by a product on "j". The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 that may be used to perform magnetic resonance fingerprinting. In addition, MRI system 100 may be used to implement the methods described herein. MM system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in Mill pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MM system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

As mentioned above, magnetic resonance fingerprinting utilizes a MRF dictionary that includes known signal evolutions. In one embodiment, the known signal evolutions may be simulated. The present disclosure provides systems and methods to create a MRF dictionary using semi-supervised learning to simulate signal evolutions. In an embodiment, the semi-supervised learning model or system is a MRF generative adversarial network (GAN). The semi-supervised learning system (e.g., MRF-GAN) may be used to generate signal evolutions for given tissue property combinations and sequence parameters. Using a semi-supervised learning system such as MRF-GAN can significantly reduce the time needed to generate a MRF dictionary, which may make it possible to generate dictionaries with tissue properties of interest on-the-fly. Using semi-supervised learning systems such as MRF-GAN may also enable the rapid calculation of dictionaries with more complex physics.

Figure 2:
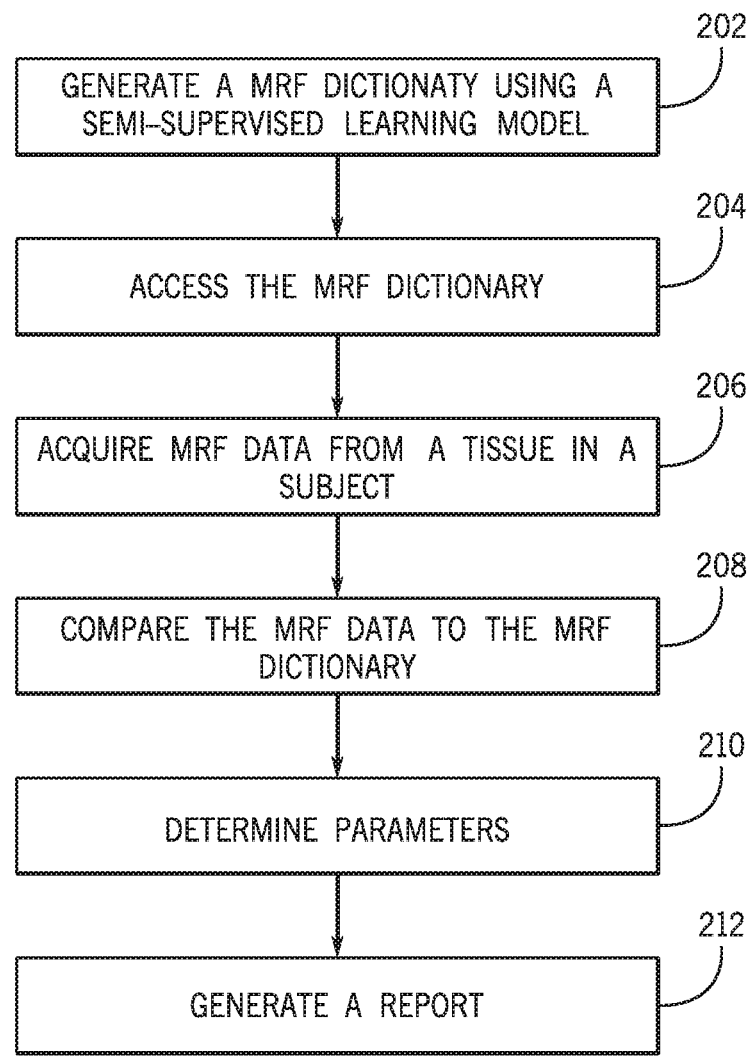
FIG. 2 illustrates a method for using an MRF dictionary generated using a semi-supervised learning system in accordance with an embodiment.

FIG. 2 illustrates a method for using a MRF dictionary generated using a semi-supervised learning system in accordance with an embodiment. At block 202, a MRF dictionary is generated using a semi-supervised learning system to simulate signal evolutions. In an embodiment, the semi-supervised learning system is a MRF generative adversarial network (GAN) as described further below with respect to FIG. 4. The MRF dictionary may be stored in memory or data storage of, for example, an MRI system (e.g., the MRI system 100 of FIG. 1) or other computer system. At block 204, the MRF dictionary is accessed. As used herein, the term "accessing" may refer to any number of activities related to retrieving or processing the MRF dictionary using, for example, MRI system 100 (shown in FIG. 1), an external network, information repository, or combinations thereof. The MRI system 100 may then be used to acquire MRF data at block 206 from a tissue in a region of interest in a subject. Acquiring MRF data may include, for example, performing a pulse sequence using a series of varied sequence blocks to elicit a series of signal evolutions from a tissue in the region of interest.

The MRF data acquired at block 206 is stored and compared to the MRF dictionary at block 208 to match the acquired signal evolutions with signal evolutions stored in the MRF dictionary. Comparing the MRF data to the MRF dictionary may be performed in a number of ways such as, for example, using a pattern matching, template matching or other matching algorithm. In one embodiment, the inner products between the normalized measured time course of each pixel and all entries of the normalized dictionary are calculated, and the dictionary entry corresponding to the maximum value of the inner product is taken to represent the closest signal evolution to the acquired signal evolution. At block 210, one or more parameters of the MRF data are determined based on the comparison and matching at block 208. The parameters may include, for example, longitudinal relaxation time (T1), transverse relaxation time (T2), main or static magnetic field ($B_0$) and proton density (PD). At block 212, a report may be generated indicating at least one of the identified parameters for the tissue in a region of interest in a subject. For example, the report may include a quantitative indication of the at least one parameter. The report may include, for example, images or maps, text or metric based reports, audio reports and the like. The report may be provided to a display (e.g., display 104, 136 or 144 shown in FIG. 1).

Figure 3:
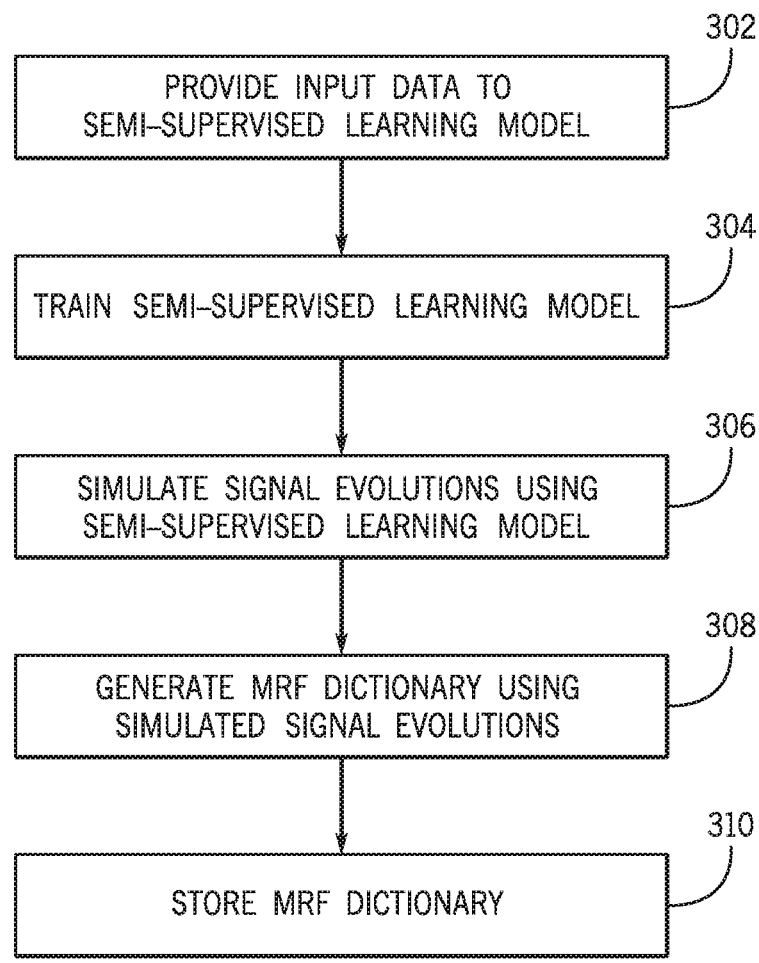
FIG. 3 illustrates a method for generating an MRF dictionary using a semisupervised learning system in accordance with an embodiment.
Figure 4:
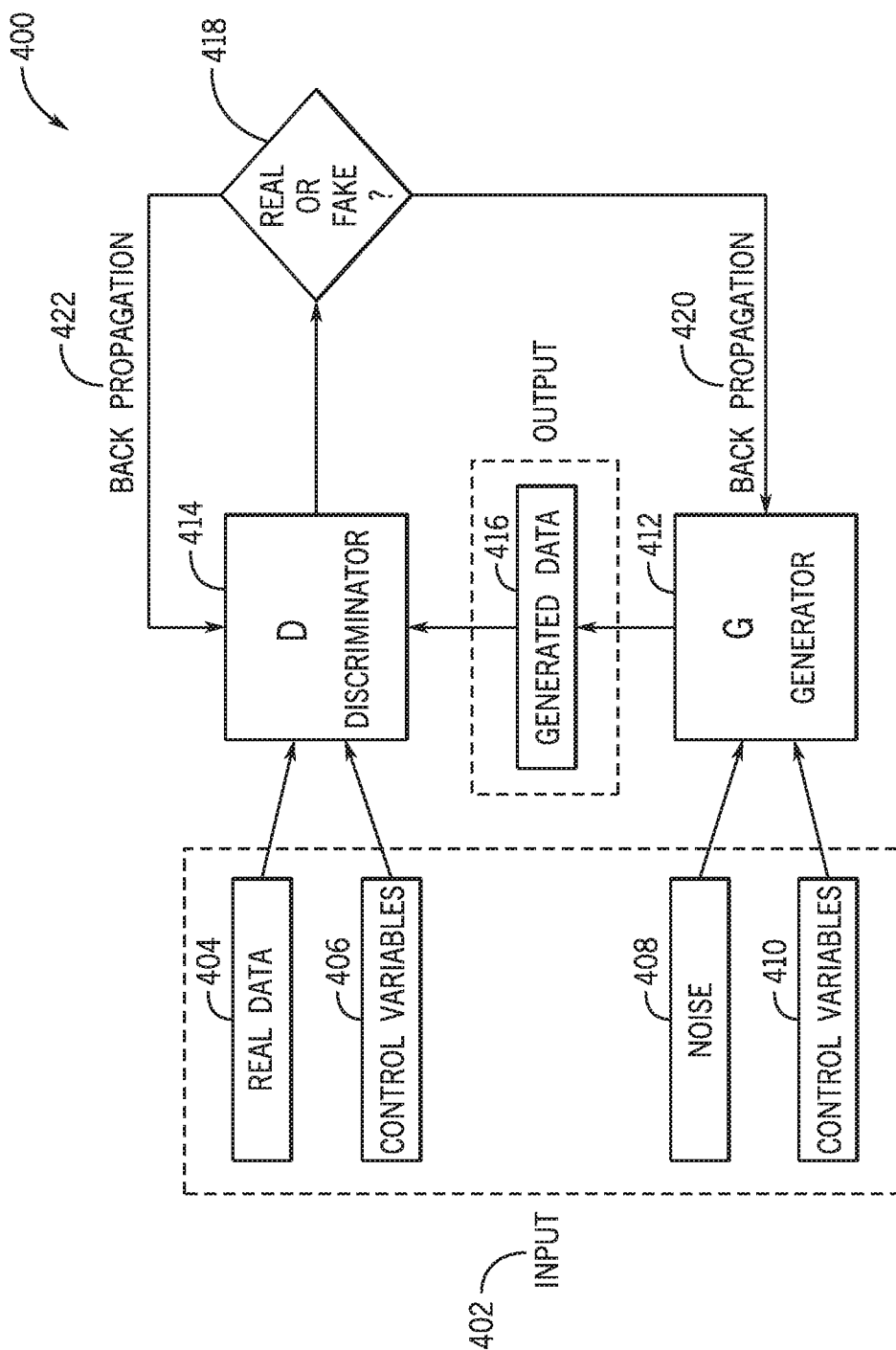
FIG. 4 is a block diagram of an MRF generative adversarial network (GAN) for generating a MRF dictionary in accordance with an embodiment.

As mentioned above with respect to block 202, the MRF dictionary may be generated using a semi-supervised learning system to simulate signal evolutions. FIG. 3 illustrates a method for generating a MRF dictionary using a semisupervised learning system in accordance with an embodiment. At block 302, a set of input data is provided to the semi-supervised learning system and, at block 304, the semi-supervised learning system is trained based on the input data. In an embodiment, the semi-supervised learning system is a MRF generative adversarial network (GAN). FIG. 4 is a block diagram of a MRF generative adversarial network (GAN) for generating a MRF dictionary in accordance with an embodiment The MRF-GAN 400 includes a generative network (or generator) 412 and a discriminative network (or discriminator) 414. Generator 412 and discriminator 414 are configured to receive input data 402. Generator 412 receives input data including noise 408 and control variables 410. Noise 408 may be random noise generated from, for example, a normal distribution. Control variables 410 may include, for example, sequence parameters and tissue properties of interest. For example, control variables 410 may include T1, T2, flip angle and repetition time. Discriminator 414 receives input data from input 402 including real (or training) data 404 and control variables 406. The real data 404 includes real signal evolutions (either acquired or simulated), for example, from an existing MRF dictionary. In one embodiment, the real data 404 may be signal evolutions directly generated from the Bloch equations. In one example, the training data simulated from the Bloch equations contains 1000 time frames and 5970 tissue property combinations with T1 values ranging from 10 ms to 2950 ms and T2 values ranging from 2 ms to 500 ms (T1≥T2). Control variables 406 may include, for example, sequence parameters and tissue properties of interest. For example, control variables 410 may include T1, T2, flip angle and repetition time. In an embodiment, the same control variables are input into the generator 412 and discriminator 414.

Generator 412 is configured to generate data that mimics real (or training) data 404 using the noise 408 and the control variables 410. The generated data 416 is provided as an output from the generator 412. The generated data 416 is also input to the discriminator 414. The discriminator 414 is configured to distinguish the generated data 416 from the real data 404. Namely, the discriminator evaluates the generated data 416 (e.g., a signal evolution generated by generator 412) for authenticity, i.e., the discriminator determines whether each signal evolution is receives from the generator 412 belongs to the real data 404 set. During training, (block 304 of FIG. 3). The discriminator 414 takes as input one or more samples from the real data 404. The control variables 406, and the generated data 416 and determines whether the generated data 416 is real or fake at block 418. The determination of whether a particular signal evolution generated by generator 412 is real or fake 418 is provided back to the generator 412 via back propagation 420 and back to the discriminator 414 via back propagation 422. The MRF-GAN 400 is formulated as a minimax game that eventually reaches the Nash equilibrium. The generative network 412 and the discriminative network 414 play a continuous game where the generator 412 is learning to provide more and more realistic signal evolutions and the discriminator 414 is learning to get better and better at distinguishing generated data 416 from real data 404. Training continues until the generated data 416 is indistinguishable from the real data 404. For example, the training of the MRF-GAN 400 should continue until the generator 412 exactly reproduces the real data and the discriminator 414 is guessing at random, unable to find a difference between the generated data 416 and the real data 404.

In one embodiment, the MRF-GAN 400 system is defined by Eqn. 5:

$$\min_{\theta_g} \min_{\theta_d} [\mathbb{E}_{x \sim p_{data}} \log D_{\theta_d}(x|y) + \mathbb{E}_{z \sim p(z)} \log(1 - D_{\theta_d}(G_{\theta_g}(z|y)|y)) + \lambda \mathbb{E}_{x \sim p_{data}, x \sim p(x)} \|x - G_{\theta_g}(z|y)\|_1]$$

where D is the discriminator, G is the generator, x is drawn from the training fingerprints simulated from Bloch equations, y is the control variable containing the corresponding sequence parameters and tissue property combination, and z is drawn from normal distribution. The minimax optimization problem in EQN 1 may be solved by alternating between:

$$\max_{\theta_d} [\mathbb{E}_{x \sim p_{data}} \log D_{\theta_d}(x|y) + \mathbb{E}_{x \sim p(z)} \log(1 - D_{\theta_d}(G_{\theta_g}(z|y)|y))] \quad \text{Eqn. 6}$$

and $$\max_{\theta_g} [\mathbb{E}_{z \sim p(z)} \log D_{\theta_d}(G_{\theta_z}(z|y)|y) - \lambda \mathbb{E}_{x \sim p_{data}, z \sim p(z)} \|x - G_{\theta_g}(z|y)\|_1] \quad \text{Eqn. 7}$$

In an embodiment, the generative network 412 and the discriminative network 414 are each built using 4 layers, with each hidden layer containing 128 neurons and followed by a rectified linear unit. The hyperbolic tangent function and the sigmoid function may be used as the activation functions for the output layers of the generative network and the discriminative network respectively.

Figures 5A, 5B, 5C:
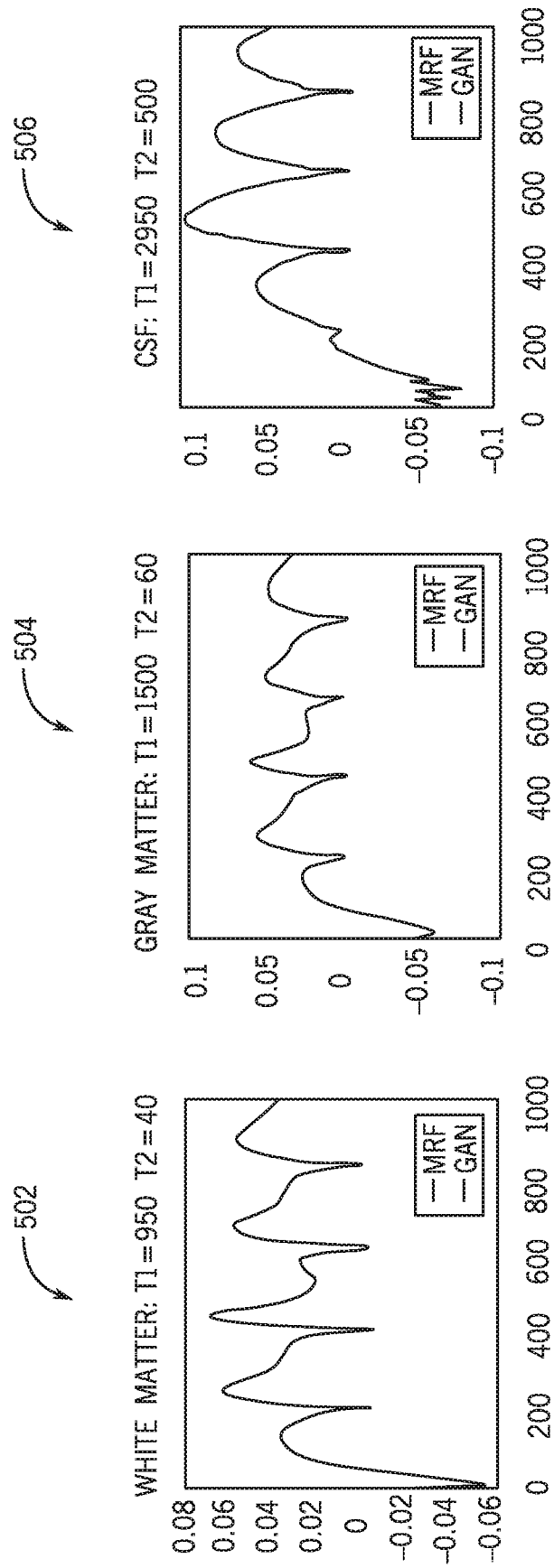
FIGS. 5A, 5B and 5C show example signal evolutions generated using a MRF generative adversarial network (GAN) in accordance with an embodiment.

Returning to FIG. 3, once the semi-supervised learning system (e.g., MRF-GAN 400 shown in FIG. 4) is trained, the semi-supervised learning system may be used to generate signal evolutions at block 306. For example, MRF-GAN 400 shown in FIG. 4, once trained, may be used to simulate signal evolutions that are indistinguishable from the real data. FIGS. 5a-5c show example signal evolutions generated using a generative adversarial network (MRF-GAN) in accordance with an embodiment. FIG. 5a shows a sample white matter MRF-GAN signal evolution (or fingerprint) with T1=950 ms and T2=40 ms. FIG. 5b shows a sample gray matter signal evolution (or fingerprint) generated by the MRF-GAN system with T1=1500 ms and T2=60 ms. FIG. 5c shows a sample CSF signal evolution (or fingerprint) generated by the MRF-GAN system with T1=2950 ms and T2=500 ms. Returning to FIG. 3, at block 308, a MRF dictionary may be generated using the signal evolutions generated by the semisupervised learning system at block 306. In an example using the MRF-GAN system, after training of the MRF-GAN, an MRF dictionary of size 1000×5970 was generated in only 7 seconds. This is a significant reduction in time as opposed to a typical 2-hour generation of, for example, an MSF-FISP dictionary. At block 310, the MRF dictionary may be stored in memory or data storage of, for example, an MRI system (e.g., the MRI system 100 of FIG. 1) or other computer system.

In one embodiment, the MRF-GAN approach described herein is robust enough to generate accurate fine MRF dictionaries using the MRF-GAN system trained from a coarse dictionary. In this embodiment, the MRF-GAN is first trained using a coarse MRF dictionary as the real (or training) data. For example, the coarse MRF dictionary may be a coarse MRF-FISP dictionary that contains 1000 time frames and 297 tissue property combinations with T1 values ranging from 10 ms to 2950 ms and T2 values ranging from 2 ms to 500 ms. A much finer MRF dictionary containing, for example, 106160 tissue property combinations may be generated using the MRF-GAN trained using the coarse MRF dictionary by refining the input T1/T2 combinations. This makes it feasible to generate on-the-fly new MRF fingerprints with the tissue property of interest as needed. It also provides the possibility to significantly reduce the time needed for large scale dictionary generation.

Computer-executable instructions for generating a magnetic resonance fingerprinting dictionary using semi-supervised learning according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention.

The invention claimed is:

1. A method for creating a dictionary for a magnetic resonance fingerprinting (MRF) reconstruction comprising:
   training a semi-supervised learning system based on at least a set of MRF data and a set of control variables;
   generating a plurality of signal evolutions using the trained semi-supervised learning system;
   generating an MRF dictionary using the plurality of signal evolutions generated using the trained semi-supervised learning system; and
   storing the MRF dictionary in a memory.

2. The method according to claim 1, wherein the semi-supervised learning system is a MRF adversarial network (GAN).

3. The method according to claim 2, wherein the MRF generative adversarial network comprises a generative network and a discriminative network.

4. The method according to claim 3, wherein the generative network generates a set of signal evolutions based on at least noise signals and the control variables.

5. The method according to claim 1, wherein the set of MRF data comprises a plurality of signal evolutions simulated using Bloch equations.

6. The method according to claim 1, wherein the control variables include at least one sequence parameter and at least one tissue property.

7. A method according to claim 6, wherein the at least one sequence parameter includes flip angle and repetition time and at least one tissue property includes T1 and T2.

8. A method for performing magnetic resonance fingerprinting comprising:
   accessing a MRF dictionary using an MRI system, the MRF dictionary generated using a semi-supervised learning system;
   acquiring MRF data from a tissue in a region of interest in a subject using the MRI system;
   comparing the MRF data to the MRF dictionary to identify at least one parameter of the MRF data; and
   generating a report indicating a value of the at least one parameter of the MRF data.

9. The method according to claim 8, wherein the semi-supervised learning system is a MRF generative adversarial network (GAN).

10. The method according to claim 9, wherein the MRF generative adversarial network comprises a generative network and a discriminative network.

11. The method according to claim 10, wherein the generative network generates a set of signal evolutions based on at least noise signals and a set of control variables.

12. The method according to claim 8, wherein generating the MRF dictionary using a semi-supervised learning system comprises:
   training the semi-supervised learning system based on at least a set of MRF data and a set of control variables;
   generating a plurality of signal evolutions using the trained semi-supervised learning system;
   generating an MRF dictionary using the plurality of signal evolutions generated using the trained semisupervised learning system; and
   storing the MRF dictionary in a memory.

13. The method according to claim 8, the report indicates at least one quantitative parameter of the MRF data.

14. The method according to claim 8, wherein the report indicates a quantitative map of the at least one parameter.

15. A magnetic resonance fingerprinting (MRF) system comprising:
   a magnet system configured to generate a polarizing magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array; and
   a computer system programmed to:
      access a MRF dictionary, the MRF dictionary generated using a semi-supervised learning system;
      acquire MRF data from a tissue in a region of interest in a subject;
      compare the MRF data to the MRF dictionary to identify at least one parameter of the MRF data; and
      generate a report indicating the at least one parameter of the MRF data.

16. The system according to claim 15, wherein the semi-supervised learning system is a MRF generative adversarial network (GAN).

17. The system according to claim 16, wherein the MRF generative adversarial network comprises a generative network and a discriminative network.

18. The system according to claim 17, wherein the generative network generates a set of signal evolutions based on at least noise signals and a set of control variables.

19. The system according to claim 15, wherein generating the MRF dictionary using a semi-supervised learning system comprises:
   training the semi-supervised learning system based on at least a set of MRF data and a set of control variables;
   generating a plurality of signal evolutions using the trained semi-supervised learning system;
   generating an MRF dictionary using the plurality of signal evolutions generated using the trained semi-supervised learning system; and
   storing the MRF dictionary in a memory.

* * * * *